United States Patent
Yi et al.

(10) Patent No.: US 8,503,217 B2
(45) Date of Patent: Aug. 6, 2013

(54) RECONFIGURABLE CROSSBAR MEMORY ARRAY

(75) Inventors: Wei Yi, Mountain View, CA (US); Gilberto Medeiros Ribeiro, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 258 days.

(21) Appl. No.: 13/098,453

(22) Filed: Apr. 30, 2011

(65) Prior Publication Data
US 2012/0275211 A1    Nov. 1, 2012

(51) Int. Cl.
*G11C 11/00*    (2006.01)

(52) U.S. Cl.
USPC ........... 365/148; 365/158; 365/171; 365/173; 977/935

(58) Field of Classification Search
USPC .......... 365/148, 158, 171, 173; 977/933–935; 257/209, 529–530, E23.147, E23.149
See application file for complete search history.

(56) References Cited

U.S. PATENT DOCUMENTS

| | | | |
|---|---|---|---|
| 2011/0292713 A1* | 12/2011 | Perner | 365/148 |
| 2012/0195099 A1* | 8/2012 | Miao et al. | 365/148 |

\* cited by examiner

*Primary Examiner* — Alexander Sofocleous
*Assistant Examiner* — Hien Nguyen (57) ABSTRACT

A two-dimensional array of switching devices comprises a plurality of crossbar tiles. Each crossbar tile has a plurality of row wire segments intersecting a plurality of column wire segments, and a plurality of switching devices each formed at an intersection of a row wire segment and a column wire segment. The array has a plurality of lateral latches disposed in a plane of the switching devices. Each lateral latch is linked to a first wire segment of a first crossbar tile and a second wire segment of a second crossbar tile opposing the first wire segment. The lateral latch is operable to close or open to form or break an electric connection between the first and second wire segments.

15 Claims, 7 Drawing Sheets

RECONFIGURABLE CROSSBAR MEMORY ARRAY

STATEMENT OF GOVERNMENT INTEREST

This invention was made with government support under Contract No. 2008-0911510-002. The government has certain rights in the invention.

BACKGROUND

Memristive devices, or memristors, are a new type of switching devices with an electrically switchable device resistance. Memristive devices are both scientifically and technically interesting, and hold promise for non-volatile memory (NVM) and other fields. As today's flash memory technology is reaching its scaling limit, there is an urgent need for new memory technologies that can meet the storage capacity and access speed demanded by future applications. Memories using resistive switching devices, such as memristors, are a promising candidate for meeting that need. For NVM applications, many memristive devices can be formed in a two-dimensional array to provide a very high storage capacity.

DETAILED DESCRIPTION

The following description provides a structure of a reconfigurable two-dimensional array of switching devices that uses lateral latches to provide regional isolation and re-routing capabilities, and a method of operation using such lateral latches.

In some embodiments, the switching devices may be memristive devices. As used herein, a memristive device is a switching device with its resistance representing its switching state, and the resistance depends on the history of the voltage and current applied to the device. The resistive state of the device may represent a digital value. For instance, a high resistance of the device may indicate that the device is in an "OFF" state, which may represent a digital "0," while a low resistance may indicate that the device is in an "ON" state, which may represent a digital "1." The memristive device may be "bipolar," meaning that the device can be switched from a low-resistance state ("LRS") to a high-resistance state ("HRS") by applying a switching voltage of one polarity, and from a high-resistance state to a low-resistance state by applying a switching voltage of the opposite polarity.

Figure 1:
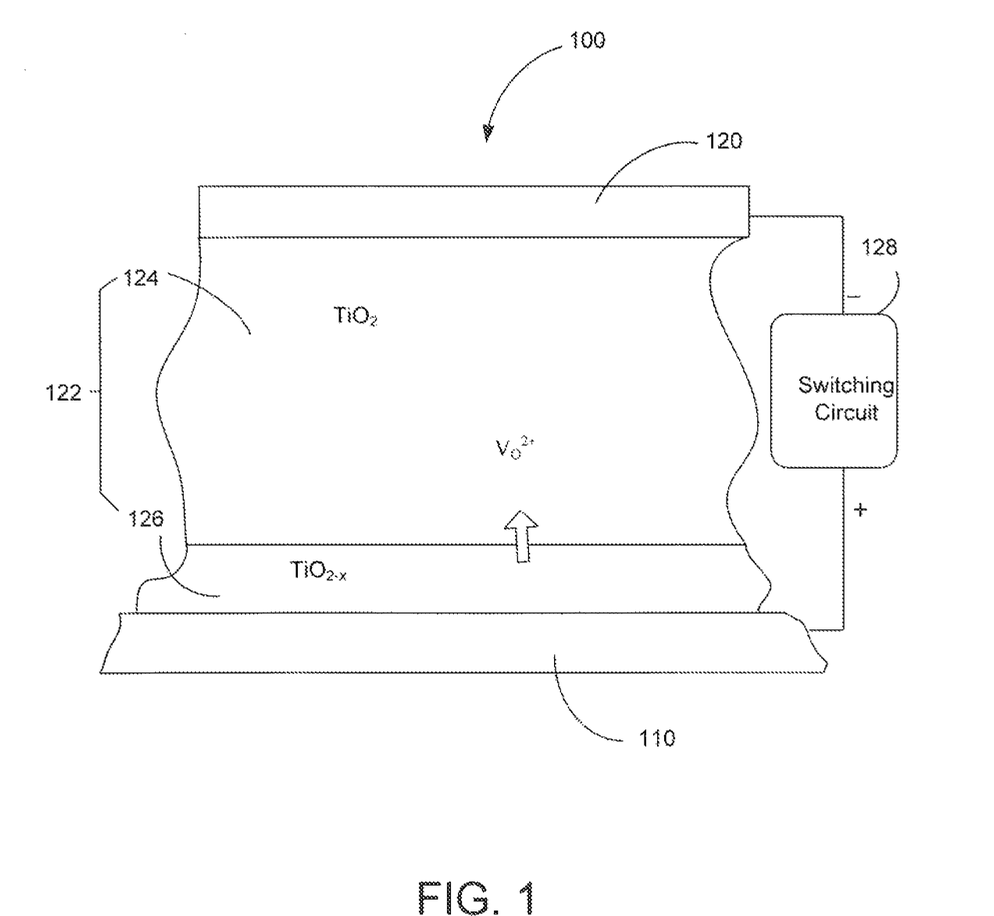
FIG. 1 is a schematic cross-sectional view of an example of a memristive device as a type of non-volatile nano-scale switching device.

FIG. 1 shows, in a schematic form, an example of a bipolar memristive device 100. In the embodiment shown in FIG. 1, the memristive device is a two-terminal device, with a top electrode 120 and a bottom electrode 110. The electrodes may be fabricated to have widths on the nanometer scale, resulting in a very small device size. An active region 122, where the switching behavior takes place, is disposed between the two electrodes. The active region 122 of the switching device 100 includes a switching material that may be electronically semiconducting or nominally insulating, as well as a weak ionic conductor. The switching material contains dopants that may be driven under a sufficiently strong electric field to drift through the switching material, resulting in changes in the resistance of the memristive device. The memristive device 100 can be used, for example, as a non-volatile memory cell, for storing digital information. Such a memory cell may be incorporated into a memory array to provide a high storage capacity.

Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The listing of possible switching materials is not exhaustive and do not restrict the scope of the present invention. The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

The memristive switching device 100 can be switched between ON and OFF states by controlling the concentration and distribution of the oxygen vacancies in the switching material in the active region 122. When a DC switching voltage is applied across the top and bottom electrodes 120 and 110, an electric field is created across the active region 122. The switching voltage and current may be supplied by a switching circuit 128. The electric field across the active region 122, if of a sufficient strength and proper polarity, may drive the oxygen vacancies to drift through the switching material towards the top electrode 120, thereby turning the device into an ON state.

By way of example, as shown in FIG. 1, in one embodiment the switching material may be $TiO_2$ In this case, the dopants that may be carried by and transported through the switching material are oxygen vacancies ($V_O^{2+}$). The active region 122 of the switching device has two sub-regions or layers: a primary region 124 and a secondary region 126. The primary region 124 is the main place where the switching behavior occurs. In the originally formed state of the device, the primary region 124 has a relatively low dopant concentration, while the secondary region 126 has a relatively high dopant level. The secondary region 126 functions as a dopant source/drain. During a switching operation, dopants may be driven from the secondary region 126 into the primary region 124, or from the primary region to the secondary region, to change the distribution of dopants in the primary region, thereby changing the conductivity across the primary region.

If the polarity of the electric field is reversed, the dopants may drift in an opposite direction across the switching material and away from the top electrode 120, thereby turning the device into an OFF state. In this way, the switching is reversible and may be repeated. Due to the relatively large electric field needed to cause dopant drifting, after the switching voltage is removed, the locations of the dopants remain stable in the switching material. The switching is bipolar in that voltages of opposite polarities are used to switch the device on and off. The state of the switching device 100 may be read by applying a read voltage to the bottom and top electrodes 110 and 120 to sense the resistance across these two electrodes. The read voltage is typically much lower than the threshold voltage required to induce drifting of the ionic dopants between the top and bottom electrodes, so that the read operation does not alter the resistance state of the switching device.

Figure 2:
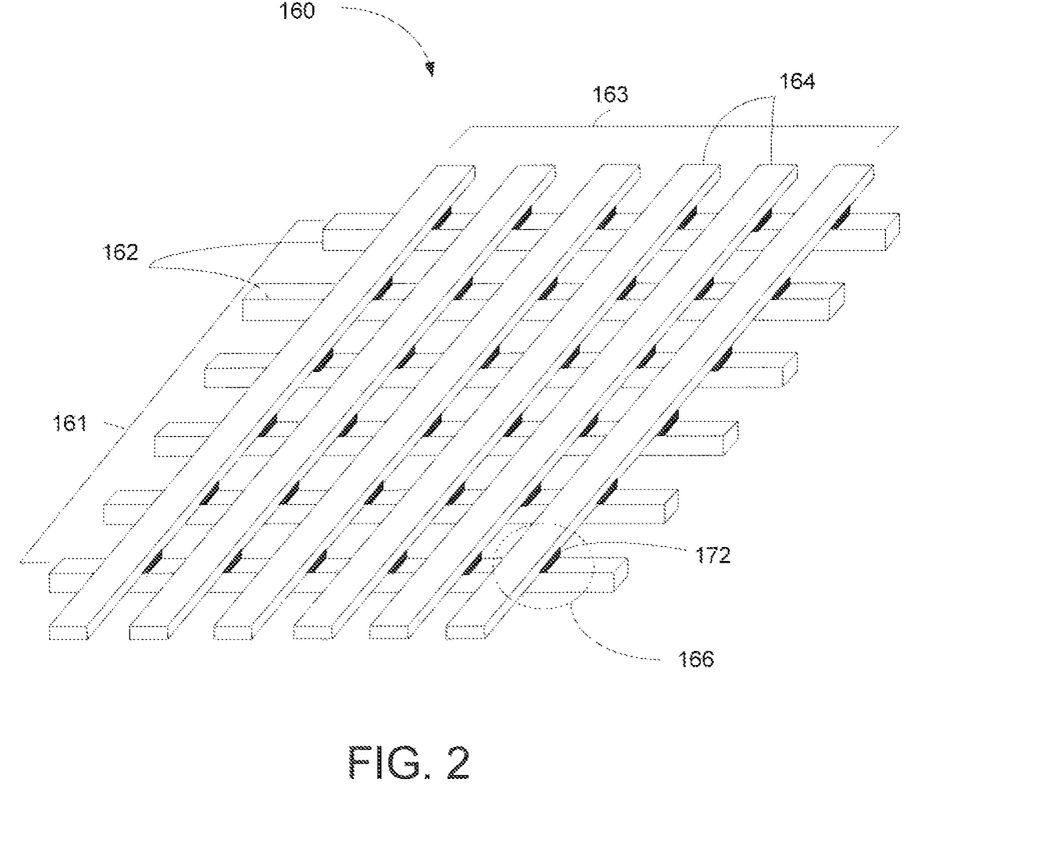
FIG. 2 is a schematic view of a two-dimensional crossbar structure containing multiple switching devices.

Memristive switching devices may be formed into an array for various applications that benefit from having a high density of switching devices. FIG. 2 shows an example of a two-dimensional array 160 of memristive switching devices. The array 160 has a first group 161 of generally parallel nanowires 162 running in a first direction, and a second group 163 of generally parallel nanowires 164 running in a second direction at an angle, such as 90 degrees, from the first direction. One group of the nanowires may be labeled as the row lines, and the other group may be labeled as the column lines. The two layers of nanowires 162 and 164 form a two-dimensional lattice which is commonly referred to as a crossbar structure, with each nanowire 162 in the first layer intersecting a plurality of the nanowires 164 of the second layer, and vice versa. A memristive switching device 166 may be formed at each intersection of the nanowires 162 and 164. The switching device 166 has a nanowire of the second group 163 as its top electrode and a nanowire of the first group 161 as the bottom electrode, and an active region 172 containing a switching material between the two nanowires. Each memristive device 166 in the two-dimensional array can be uniquely addressed by selecting the row line and column line that form the electrodes of the memristive device.

The crossbar structure in FIG. 2 provides an effective way to achieve a high density of switching devices in a two-dimensional array. The number of rows and columns of the crossbar can be made large to have a large number of switching devices formed in a plane. Nevertheless, if the two-dimensional array is large, it may be desirable to provide configurability of the array so that some portions of the array may be selectably connected to or disconnected from the other portions. For instance, as the number of switching devices on each row or column wire segment increases, the leakage current in a write or read operation due to the "half-select" problem also increases and can make the write or read operation more difficult. In that case, it may be desirable to be able to partition the large two-dimensional array into smaller isolatable portions so that the number of half-selected devices within each portion is kept small. Also, in some applications, it may be useful to be able to do rerouting of connections to, for example, avoid a patch of defective switching devices in the two-dimensional array. As another example, it may desirable to have a portion of the two-dimensional array set aside as a backup segment, which is to be activated only when needed.

Figure 3:
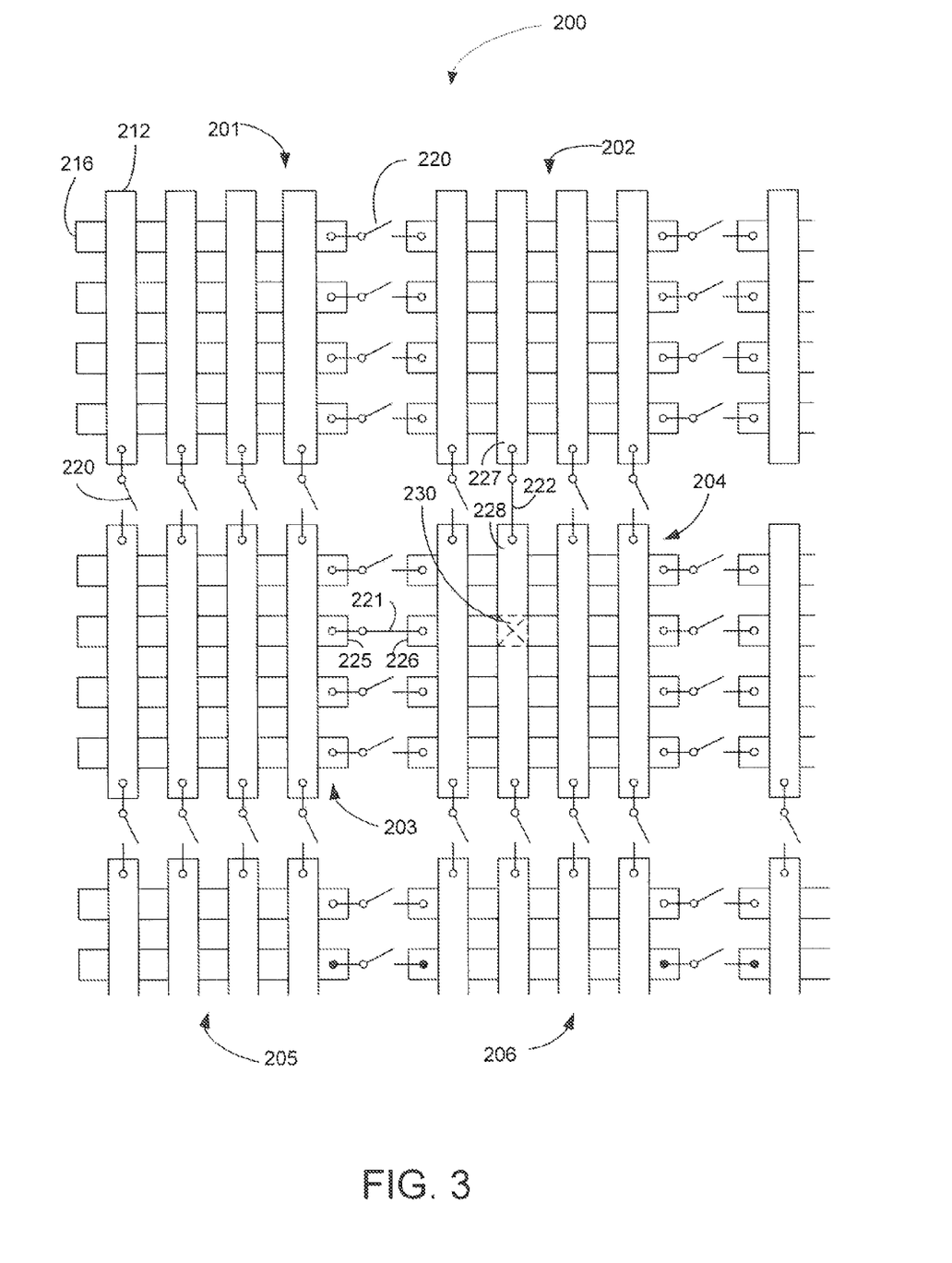
FIG. 3 is a top schematic view of a reconfigurable two-dimensional array formed of multiple crossbar tiles linked by lateral latches.

The description below provides an effective way to provide reconfigurability in a two-dimensional array of switching devices based on the crossbar structure. As illustrated in FIG. 3, the two-dimensional array 200 comprises a plurality of crossbar tiles 201-206. Each crossbar tile has a crossbar structure similar to that shown in FIG. 2, with a plurality of row wire segments 212 intersecting a plurality of column wire segments 216, and a switching device may be formed at each intersection of the row and column wire segments. Thus, each crossbar tile is a crossbar in itself, but the word "tile" is used to indicated that such a cross bar structure is used as a building block to construct a larger two-dimensional array 200. In FIG. 3, for clarity of illustration, each of the crossbar tiles 201-206 has only four row wire segments and four column wire segments. It should be understood, however, that the size of each crossbar tile can be chosen to have the desired number of memristive devices on each row or wire segment, and that the crossbar tiles in the array 200 do not have to have the same size.

The crossbar tiles 201-206 are linked, or "stitched" together, by a plurality of lateral latches 220. The word "lateral" as used herein means that the latches are used to provide horizontal connections within the plane of the two-dimensional array of switching devices. The latches 220 include row latches and column latches. Each row latch connects a row wire segment of one crossbar tile to a corresponding row wire segment of an adjacent crossbar tile. Similarly, each column latch connects a column wire segment of a crossbar tile to a corresponding column wire segment of an adjacent crossbar tile. Each lateral latch 220 can be operated to make or break the electric connection between the two wire segments connected thereto. For instance, when the row latch 221 and column latch 222 are closed, the row wire segment 225 is electrically connected to the row wire segment 226, and the Column wire segment 227 is electrically connected to the column wire segment 228. Such electric connections allow a read or write voltage to be applied to the switching device 230 formed at the intersection of the row wire segment 226 and the column wire segment 228 via the wire segments 225 and 227 and the row and column latches 221 and 222, respectively. Thus, the switching device 230 can be made operational when the latches 221 and 222 are closed. On the other hand, if either of the latches 221 and 222 is open, a read or write voltage cannot be effectively applied to the switching device 230. In other words, the switching device 230 can be made inactive by opening either lateral latch. In this regard, it should be noted that when a wire segment is disconnected, all the memory cells on that wire segment are inactivated. By opening the lateral latches connecting a crossbar tile (e.g., the crossbar tile 204) to its neighbors, the crossbar tile can be isolated from the rest of the tow-dimensional array 200.

Figure 4:
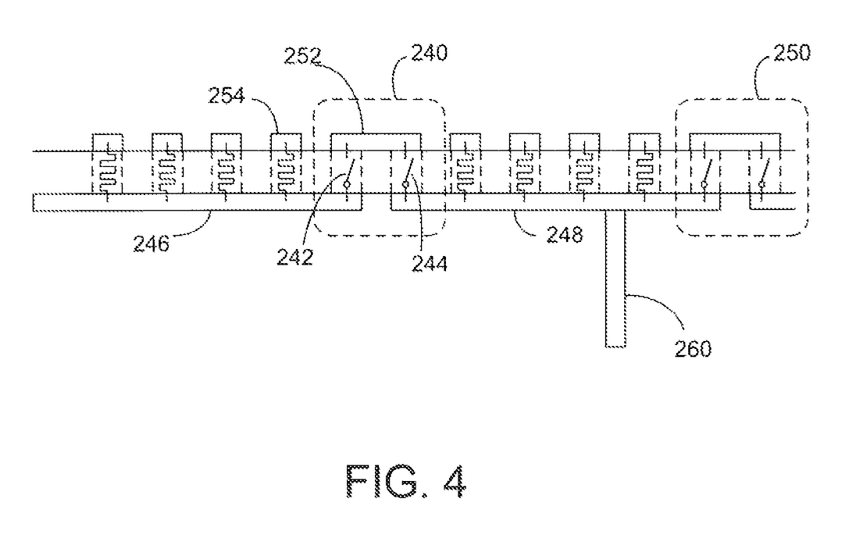
FIG. 4 is a cross sectional schematic view of one embodiment of a lateral latch used to link two adjacent row or column wire segments.

The lateral latches 220 linking the crossbar tiles in the two-dimensional array 200 may be implemented in different ways. One approach of forming a lateral latch is shown in FIG. 4. In this embodiment, the lateral latch 240 comprises two side-by-side switching devices 242 and 244. As shown in FIG. 4, the lateral latch 240 connects two row wire segments 246 and 248 in two adjacent crossbar tiles. The latch 240 has a top electrode 252, which extends in parallel (shown in FIG. 4 as extending into the page) with the column wire segments 254 in the two adjacent crossbar tiles, and uses terminals of the two row wire segments 246 and 248 as its bottom electrodes. A first switching device 242 is formed between the top electrode 252 and the first row wire segment 246, and a second switching device 244 is formed between the top electrode 252 and the other row wire segment 248. The construction of each of the switching devices 242 and 244 may be similar to that of the memristive device in FIG. 1 as described above. In other words, each switching device 242 or 244 may have an active region with mobile ion dopants disposed between the top and bottom electrodes, and the device may be switched ON or OFF by applying a switching voltage to change the dopant distribution. In this regard, to perform the latching function effectively, the switching characteristics of the switching devices 242 and 244 may be different from the memristive devices on the wire segments to be connected. For instance, the switching devices in the lateral latch may be made to have a relatively high resistance for the OFF state ($R_{OFF}$), as compared to the regular memristive devices in the array, to ensure good electric isolation between the wire segments when the latch is open. The switching devices in the latch may be made to have a very low resistance for the ON state ($R_{ON}$), to reduce the voltage drop across the latch in a read or write operation. Also, the endurance requirement for the switching devices in the lateral latches may be relaxed, if the latches are not intended to be programmed frequently.

When both switching devices 242 and 244 are put in the ON state, a low-resistance path is formed that goes from the first row wire segment 246 through the first switching device 242, the top electrode 252, and the second switching device 244 to the second row wire segment 246. Similarly, a lateral latch may be formed to connect two column wire segments in two adjacent crossbar tiles. In that case, the latch has a bottom electrode that extends in parallel with the row wire segments of the crossbar tiles, and uses the column wire segments being linked as the top electrodes, to from the two switching devices.

To operate the latch 240, proper voltages should be applied to the top electrode 252 and the wire segments 246, 248 that form the bottom electrodes of the latch. For a wire segment that has both ends connected by latches, a separate connection may be needed to apply the operation voltage. For instance, the wire segment 248 is connected on both ends by the latches 240 and 250. If both the latches 240 and 250 are open, the operation voltage from an external drive circuit will not reach the wire segment 248 via the latches. In that situation, a via 260 that connects the wire segment 248 to a different plane in the device stack may be used to provide the electric connection needed for applying the operation voltage.

Figure 5:
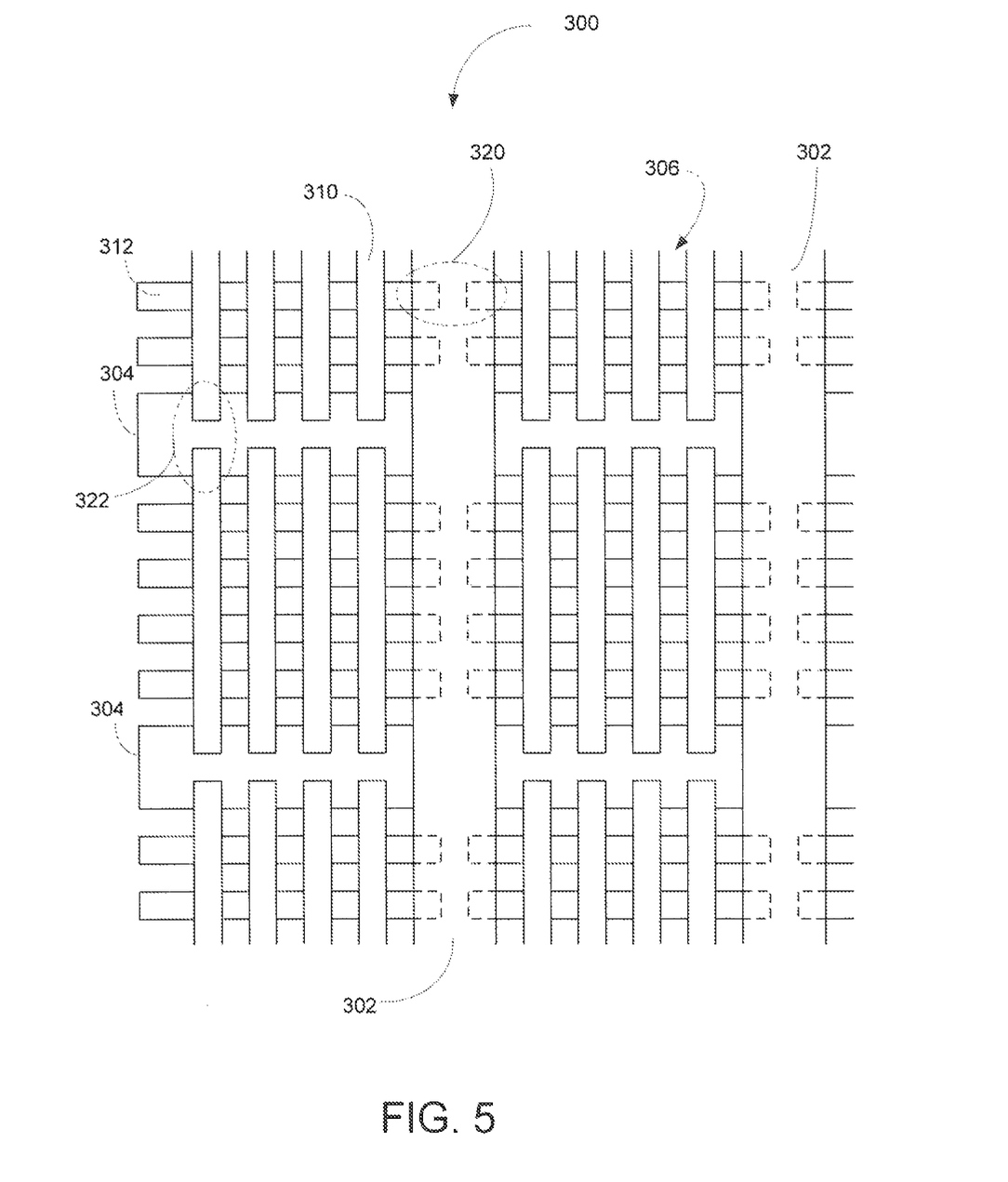
FIG. 5 is a top view of a two-dimensional array with latch electrode wires running in the column and row directions.

FIG. 5 shows a top view of a two-dimensional array that utilizes lateral latches of the type shown in FIG. 4 to provide reconfigurability. As shown in FIG. 5, the memory array 300 has multiple crossbar tiles 306 that are interleaved with row latch electrode wires 302 and column latch electrode wires 304. The row latch electrode wire 302 extends parallel to the column wire segments 310 in the crossbar tiles, and the column latch electrode wire 304 extends parallel to the row wire segments 312. A lateral row latch is formed at each intersection 320 of the row latching wire 302 with two opposing row wire segments from two adjacent crossbar tiles. Similarly, a lateral column latch is formed at each intersection 322 of the column latching wire 304 with two opposing column wire segments.

Figure 6:
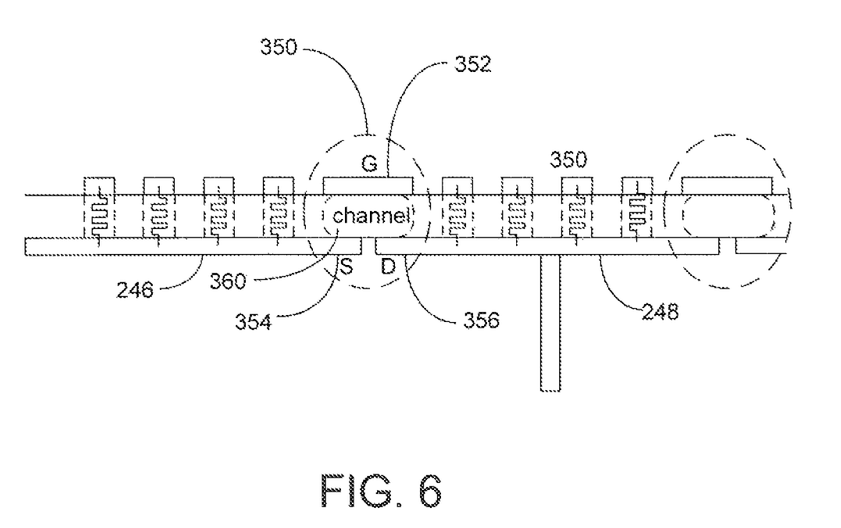
FIG. 6 is a cross-sectional schematic view of two adjacent row or column wire segments linked by a lateral latch in the form of an atomic transistor.

Turning now to FIG. 6, in another embodiment, a lateral latch may be in the form of a nonvolatile transistor 350, the conductivity of which is controlled by a gate voltage. A nonvolatile transistor is able to maintain its ON/OFF conduction state even when the gate voltage is removed. The transistor 350 has a gate electrode 352 that overlaps the opposing ends of two row wire segments 246 and 248 being connected. The terminals of the two wire segments 246 and 248 form the source and drain electrodes 354 and 356 of the transistor 350, and the channel 360 of the transistor is disposed between the gate electrode 352 and the source and drain electrodes. The channel 360 may be made to be highly conductive or highly resistive, depending on the gate voltage applied to the gate electrode 352. When the channel 360 is highly conductive (i.e., the transistor 350 is ON), the two row wire segments 246 and 248 are electrically connected. When the channel 360 has a high resistance, the transistor 350 is OFF, and the two row wire segments 246 and 248 are electrically isolated. A transistor may also be used to link two column wire segments. In that case, the gate electrode of the transistor may be a bottom electrode that overlaps the two column wire segments, which form the source and drain electrodes of the transistor, respectively.

One type of nonvolatile transistors that is suitable for this application of lateral latching is the atomic transistor. In one form of an atomic transistor, the conduction between the source and drain electrodes can be turned on or off based on an electrochemical reduction-oxidation, or "redox," effect. The gate electrode 352 is formed of a suitable metal, and the channel region 360 between the gate electrode and the drain and source electrodes 354 and 356 is formed of a material that allows diffusion of metal cations from the gate electrode when a positive voltage is applied. The metal cations diffused into the channel region can be reduced back to metal atoms and form a conductive path between the source and drain electrodes 354 and 356. The concentration of the metal cations in the channel region can be controlled by changing the gate electric field. As a result, the conductivity of the channel region can be changed from that an insulator to a highly conductive state, and vice versa. The switching of the channel conductivity can be non-volatile, so that even when the gate voltage is removed, the channel maintains its conductivity state. In one example of an atomic transistor, the gate electrode may be formed of copper, and the channel region may be formed of $Ta_2O_5$. Other combinations of metals for the gate electrode and oxides or other materials for the channel material may also be used to construct an atomic transistor.

The layout of conductors shown in FIG. 5 can also be used to implement the latching transistors of FIG. 6. For instance, the row latch electrode wires 302 may be used as the gate electrodes of the transistors for latching row wire segments, and the column latch electrode wires 304 may be the gate electrodes of the transistors for latching column wire segments.

Figure 7:
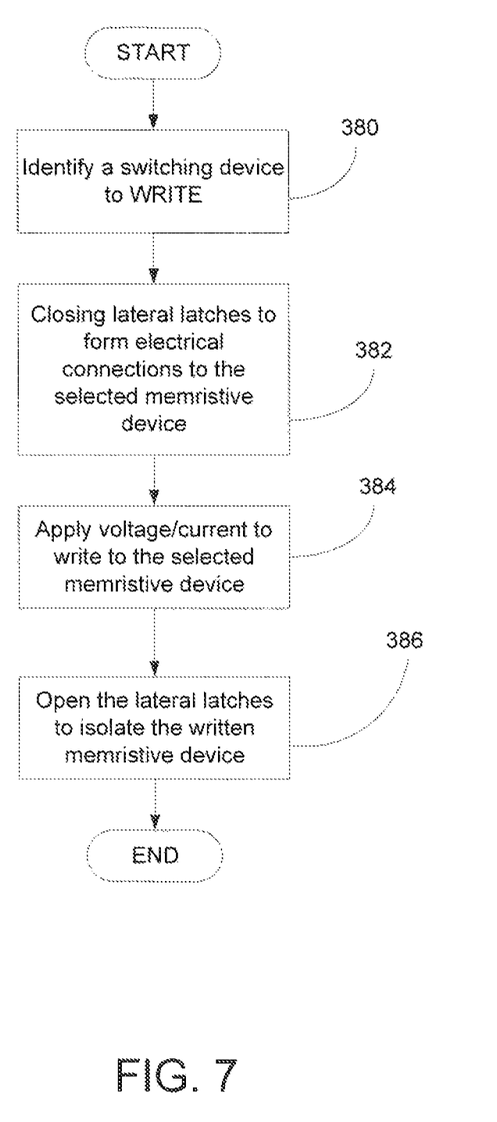
FIG. 7 is a flow chart showing an operation to write to a selected switching device in the two-dimensional array.

The reconfigurability of the two-dimensional array provided by the use of lateral latches allows significant flexibility in the operation of the array. In some operations, the latches can be used to isolate the array into smaller segments, such as individual crossbar tiles, before writing to a selected switching device. By isolating the region of the selected device from the rest of the array, the number of half-selected devices is reduced, resulting in a lower leakage current during a write operation. Referring now to FIG. 7, to write to a selected switching device, the location of the switching device is first identified (step 380), so that the electric connections to that switching device can be established. To that end, the later latches connecting the row and column wire segments of the selected switching device to the external drive circuit for the write operation are closed (step 382). In this regard, it should be noted that there may be multiple row wire segments between the selected row wire segment and the external supply, and multiple column wire segments between the selected column wire segment and the external supply. All the lateral latches linking those wire segments are closed to establish the electric connections to the selected switching device. After the electric connections are formed, a switching voltage is applied to the electrodes of the switching device to cause the device to change its state from OFF to ON, or from ON to OFF (step 384). To avoid accidental altering of the conduction states of the latches during the write operation, a proper biasing scheme may be applied. For instance, if a positive half of the switching voltage is applied to the row wire segment of the device being switched and a negative half is applied to its column wire segment, then the latch electrode wires may be connected to ground, so that the voltage drop across each latch is not sufficient to reverse the conduction state of the latch. After the write operation is carried out, the crossbar tile containing the switching device can again be isolated from the adjacent crossbar tiles by resetting the lateral latches to their open states (step 386).

In other applications, the reconfiguration mechanism can be used to disconnect a segment in the two-dimensional array that contains malfunctioning devices. It can also be used to connect a backup section of the two-dimensional array to maintain the functionality and storage size of the entire memory array. There are other scenarios in which the reconfiguration capability of the two-dimensional array can be used to enhance the performance and reliability of the array.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A two-dimensional array of switching devices, comprising:
   a plurality of crossbar tiles, each crossbar tile having a plurality of row wire segments intersecting a plurality of column wire segments, and a plurality of switching devices each formed at an intersection of a row wire segment and a column wire segment; and
   a plurality of lateral latches, each lateral latch being disposed in a plane of the switching devices and linked to a first wire segment of a first crossbar tile and a second wire segment of a second crossbar tile opposing the first wire segment, said each lateral latch being operable to close or open to form or break an electric connection between the first and second wire segments.

2. A two-dimensional array as in claim 1, wherein the switching devices are memristive devices.

3. A two-dimensional array as in claim 1, wherein each lateral latch comprises a first switch and a second switch, the first switch being formed between the first wire segment and a latch electrode, and the second switch being formed between the latch electrode and the second wire segment.

4. A two-dimensional array as in claim 3, wherein the latch electrode is a portion of a latch electrode wire extending in a direction perpendicular to the first and second wire segments.

5. A two-dimensional array as in claim 4, wherein the first and second switches are memristive devices.

6. A two-dimensional array as in claim 1, wherein each lateral latch is a nonvolatile transistor.

7. A two-dimensional array as in claim 6, wherein the transistor is an atomic transistor having a gate electrode and a channel region formed between the gate electrode and ends of the first and second wire segments.

8. A two-dimensional array as in claim 1, wherein the gate electrode is a portion of a latch electrode wire extending in a direction perpendicular to the first and second wire segments.

9. A two-dimensional array of switching devices, comprising:
   a plurality of crossbar tiles, each crossbar tile having a plurality of row wire segments intersecting a plurality of column wire segments, and a plurality of switching devices each formed at an intersection of a row wire segment and a column wire segment;
   a row latch electrode wire extending parallel to the column wire segments and overlapping ends of a first row wire segment of a first crossbar tile and a second row wire segment of a second crossbar tile;
   a column latch electrode wire extending parallel to the row wire segments and overlapping ends of a first column wire segment of the first crossbar tile and a second column wire segment of a third crossbar tile;
   a row latch formed between the row latch electrode wire and the first and second row wire segments, the row latch being operable to form or break an electric connection between the first and second row wire segments; and
   a column latch formed between the column latch electrode wire and the first and second column wire segments, the column latch being operable to form of break an electric connection between the first and second column wire segments.

10. A two-dimensional array as in claim 9, wherein the switching devices are memristive devices.

11. A two-dimensional array as in claim 10, wherein each of the row latch and the column latch includes two side-by-side switches, each switch being a memristive device.

12. A two-dimensional array as in claim 11, wherein each of the row latch and the column latch is a transistor.

13. A two-dimensional array as in claim 12, where the transistor is an atomic transistor.

14. A method of writing to a selected switching device within a two-dimensional array, the selected switching device being formed at an intersection of a first row wire segment and a first column wire segment of a first crossbar tile in the two-dimensional array, the method comprising:
   closing a row latch to electrically connect the first row wire segment with a second row wire segment in a second crossbar tile adjacent the first crossbar tile;
   closing a column latch to electrically connect the first column wire segment with a second column wire segment in a third crossbar tile adjacent the first crossbar tile;
   writing to the selected switching device by applying a write voltage to the first row wire segment and the first column wire segment via the closed row and column latches.

15. A method of writing as in claim 14, further including the step of opening the row latch and the column latch after the writing step.

* * * * *